(12) United States Patent
Jiang

(10) Patent No.: US 11,617,244 B2
(45) Date of Patent: Mar. 28, 2023

(54) LIGHT APPARATUS

(71) Applicant: XIAMEN ECO LIGHTING CO. LTD., Xiamen (CN)

(72) Inventor: Hong Kui Jiang, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 56 days.

(21) Appl. No.: 16/751,506

(22) Filed: Jan. 24, 2020

(65) Prior Publication Data

US 2020/0245426 A1 Jul. 30, 2020

Related U.S. Application Data

(60) Provisional application No. 62/796,117, filed on Jan. 24, 2019.

(51) Int. Cl.
| | |
|---|---|
| *H05B 45/20* | (2020.01) |
| *H05B 45/325* | (2020.01) |
| *H01L 27/15* | (2006.01) |
| *H05B 47/155* | (2020.01) |
| *H01L 33/50* | (2010.01) |
| *H05B 47/19* | (2020.01) |

(52) U.S. Cl.
CPC .......... *H05B 45/20* (2020.01); *H01L 27/153* (2013.01); *H01L 33/504* (2013.01); *H05B 45/325* (2020.01); *H05B 47/155* (2020.01); *H05B 47/19* (2020.01)

(58) Field of Classification Search
CPC .... H05B 45/20; H05B 45/325; H05B 47/155; H05B 47/19; H01L 33/504; H01L 33/50; H01L 25/075; H01L 27/153; F21Y 2115/10; F21Y 2107/70; F21K 9/232
See application file for complete search history.

(56) References Cited

U.S. PATENT DOCUMENTS

| | | | |
|---|---|---|---|
| 2011/0278605 A1* | 11/2011 | Agatani | H01L 25/0753 257/89 |
| 2017/0086391 A1* | 3/2017 | Vilgiate | H05B 45/00 |
| 2018/0037738 A1* | 2/2018 | Kuks | G03F 7/0007 |

* cited by examiner

*Primary Examiner* — Seokjin Kim
(74) *Attorney, Agent, or Firm* — Chun-Ming Shih; Lanway IPR Services

(57) ABSTRACT

A light apparatus includes at least one elongated substrate mounted with a first light emitted diode covered with a first fluorescent layer and a second light emitted diode not covered with fluorescent layer. The light apparatus also has a driver circuit supplying a driving current to the first light emitted diode and the second light emitted diode and a control circuit.

22 Claims, 5 Drawing Sheets

LIGHT APPARATUS

RELATED APPLICATION

The present application claims priority of a provisional application No. 62/793,847.

FIELD

The present invention is related to a light apparatus and more particularly related to a light apparatus with multiple types of light emitted diodes.

BACKGROUND

Since Edison invents the first popular light bulbs, there is a high interest in incandescent light bulbs with elongated filaments. When LED (Light Emitted Diode) starts its revolution in light technology, the need is still existed.

Therefore, it would be beneficial to develop a convenient, interesting, flexible light apparatus that may fit the needs to enhance human life.

SUMMARY OF INVENTION

In some embodiments, a light apparatus like a light bulb, a down light, a panel light, a light tube includes at least one elongated substrate mounted with a first light emitted diode covered with a first fluorescent layer and a second light emitted diode not covered with fluorescent layer.

Specifically, there may be only one elongated substrate mounted with one or more of the first light emitted diode and the second light emitted diode. There may be two or more elongated substrates respectively mounted with the first light emitted diode and the second light emitted diode. The first light emitted diode and the second light emitted diode may be disposed on the same elongated substrate or on separate elongated substrate.

The first light emitted diode may be a blue light light emitted diode covered with the first fluorescent layer for emitting a white light with a first color temperature. In some embodiments, there may be a third light emitted diode covered with a third fluorescent layer also emitting a white light but with a different color temperature. In such case, the first light emitted diode and the third light emitted diode may be mixed for generating a white light with a mixed color temperature.

The first light emitted diode and the third light emitted diode may be packaged or disposed adjacent to each other to enhance mixing effect.

The second light emitted diode may emit a red light. In addition, there may be a fourth light emitted diode, a fifth light light emitted diode emitting lights of different color like a blue light and a green light. The second light emitted diode, the fourth light emitted diode and the fifth light emitted diode may be used to mix a mixed color light output.

Furthermore, the first light emitted diode and the third light emitted diode may be adjusted for their output light strengths so that to mix a white light with a different color temperature.

Similarly, the second light emitted diode, the fourth light emitted diode and the fifth light emitted diode may be adjusted for their output strengths to generate a different light output.

There may be a first mode, in which only the first light emitted diode and the third light emitted diode are activated while the second light emitted diode, the fourth light emitted diode, and the fifth light emitted diode are deactivated. There may be a second mode, in which only the second light emitted diode, the fourth light emitted diode, the fifth light emitted diode are activated while the first light emitted diode and the third light emitted diode are deactivated.

There may be a third mode, in which all light emitted diodes are activated but adjusted to obtained a desired light parameter.

The light apparatus also has a driver circuit supplying a driving current to the first light emitted diode and the second light emitted diode. For example, the driver circuit may include multiple components including passive components and active components for converting a 110V or 220V AC power source to a DC driving current or multiple DC driving currents to the first light emitted diode and the second light emitted diode. A current source circuit may be used for generating a stable, variable current or PWM (Pulse Width Modulation) circuit may be integrated for generating corresponding driving currents to the light emitted diodes.

The light emitted diodes may include light emitted diode chips and corresponding circuits.

The light apparatus also has a control circuit connected to the driver circuit for mixing a first light output with the first light emitted diode and the second light emitted diode.

The control circuit may be programmed or hard wired for storing status, setting or parameters of the light emitted diodes. Specifically, the control circuit may be integrated together with the driver circuit or be a separate component that receives command or settings for controlling the driver circuit to generate corresponding currents to drive the light emitted diode to obtained desired light output.

In some embodiments, wherein the first light emitted diode emits a white light, and the second light emitted diode emits a non-white light.

In some embodiments, the light apparatus may also include a third light emitted diode covered with a third fluorescent layer, wherein the first fluorescent layer is different from the third fluorescent layer so that the first light emitted diode combined with the first fluorescent layer and the third light emitted diode combined with the third fluorescent layer emit white lights of different color temperatures.

In some embodiments, the control circuit adjusts the output strength ratio between the first light emitted diode and the third light emitted diode to obtain a mixed white light with a mixed color temperature.

In some embodiments, the control circuit changes a relative duty ratio between the first light emitted diode and the third light emitted diode. Specifically, in PWM driving scheme, by adjusting duty ratio, the output strength may be changed accordingly.

In some embodiments, 6. The light apparatus of claim 4, wherein the control circuit changes a relative current ratio between the first light emitted diode and the third light emitted diode.

In some embodiments, the second light emitted diode emits a second light with a second non-white color.

In some embodiments, the light apparatus also includes a fourth light emitted diode and a fifth light emitted diode respectively emit a fourth light with a fourth non-white color and a fifth light with a fifth non-white color, the second non-white color. The fourth non-white color and the fifth non-white color are different colors.

For example, the second light emitted diode emits red light, the fourth light emitted diode emits green light and the fifth light emitted diode emits blue light.

In some embodiments, the control circuit adjusts output strengths of the second light emitted diode, the fourth light emitted diode and the fifth light emitted diode to change the non-white color.

In some embodiments, the control circuit has a first mode and a second mode. The first light emitted diode is mixed with a third light emitted diode to generate a mixed white light of a mixed color temperature in the first mode.

The second light emitted diode is mixed with a fourth light emitted diode and a fifth light emitted diode to mix a mixed light with a mixed color. The second light emitted diode, the fourth light emitted diode and the fifth light emitted diode emit lights of different colors.

In some embodiments, the first mode and the second mode are not activated at the same time.

In some embodiments, the light apparatus also includes a bulb shell and a bulb cap. The bulb cap contains the driver circuit and the control circuit and the elongated substrate is enclosed in the bulb shell.

The elongated substrate may be made of rigid material. For example, the elongated substrate may include an aluminum layer, an insulation layer, a wiring layer, and a light emitted diode mounting layer for mounting the light emitted diodes.

Each elongated substrate may also has two electrodes to be connected to other elongated substrate to construct a three-dimension light body emitting light evenly in a three-dimension space.

In some embodiments, the elongated substrate is made of a flexible material and is bent with a curve shape. For example, the elongated substrate may include a flexible printed circuit board for mounting the light emitted diodes. Some additional layer like thin aluminum layer may be attached so as to keep the bent shape of the elongated substrate.

In some embodiments, the elongated substrate is a rigid material.

In some embodiments, there are multiple elongated substrates connected forming a three-dimension light emitting body.

In some embodiments, there is a central column supporting tops of the multiple elongated substrates.

In some embodiments, the elongated substrate has multiple segments, some segments are covered with the first fluorescent layer.

In some embodiments, there are multiple elongated substrates, at least one elongated substrate mounted with only the first light emitted diode and at least another elongated substrate mounted with a second light emitted diode.

In some embodiments, the first light emitted diode and the second light emitted diode respectively have a first light spanning area and a second light spanning area, the first light spanning area and the second light spanning area are overlapped.

In some embodiments, light spanning areas of a plurality of the elongated substrates overlap so that the first light spanning area and the second light spanning area are overlapped.

Specifically, there is a main light emitting area in which accumulates main light output, e.g. 120 degrees, for forming a light spanning area of a light diode. When multiple light diodes are placed in an elongated substrate, there is a main light output area, e.g. 90% of light, in a light spanning area of the elongated substrate.

By arranging the pose, angle and position of the light emitted diodes and the elongated substrate to keep the light output of different types of light emitted diodes to overlap at least partially enhance the final mixed light characteristic.

In some embodiments, there are multiple first light emitted diodes and multiple second light emitted diodes disposed across to each other.

In some embodiments, the light apparatus also includes a wireless circuit connected to the control circuit.

In some embodiments, the wireless circuit receives an external command for the control circuit to determine how to mix the first light output of the first light emitted diode and the second light emitted diode.

In addition, the wireless circuit may be connected to an antenna that is placed away from the driver circuit, e.g. in a light bulb shell instead of being concealed in a light bulb cap for enhancing wireless signal quality.

In some embodiments, the light apparatus also includes a manual switch for indicating a mixed parameter of the first light emitted diode and the second light emitted diode.

In some embodiments, the first light emitted diode and the second light emitted diode are packaged as a packaged module. Specifically, the first light emitted diode and the second emitted diode may be integrated and packaged together. In some other embodiments, the first light emitted diode is integrated with the third light emitted diode in a package while the second light emitted diode, the fourth light emitted diode and the fifth light emitted diode are integrated in another package.

In some embodiments, the packaged module also has a third light emitted diode covered with a third fluorescent layer for emitting a third white light, a fourth light emitted diode and a fifth light emitted diode for emitting different colors as the second light emitted diode.

DETAILED DESCRIPTION

Figure 1:
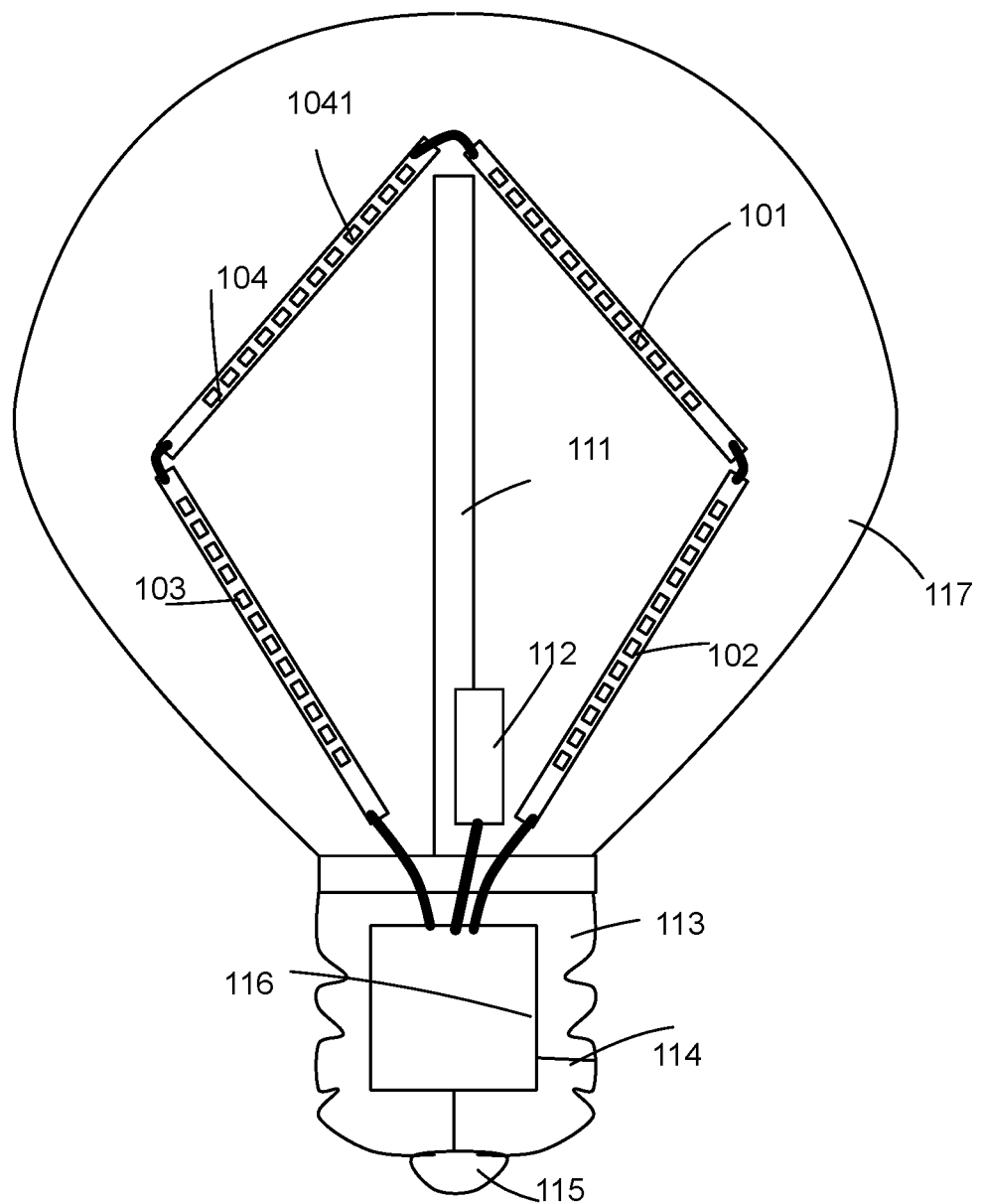
FIG. 1 illustrates an illustrated diagram of components in a light apparatus embodiment.

Please refer to FIG. 1. FIG. 1 illustrates an illustrated diagram of components in a light apparatus embodiment.

In FIG. 1, a light apparatus, as a light bulb, includes four elongated substrates 101, 102, 103, 104 mounted with multiple light emitted diodes, e.g. the light emitted diode 1041. In this example, the four elongated substrates 101, 102, 103, 104 form four filaments connected in series. Please be noted that other arrangement of the filaments may be chosen depending on different design needs.

In this example, there is a central support 111. There is also an antenna 112 enclosed in the light bulb shell 117, instead of being concealed in the light bulb cap 113. There is a wireless circuit integrated with a driver circuit 116 in this example. A gas entrance may be provided during manufacturing for installing heat dissipation gas to the light bulb shell to protect the light emitted diodes.

There are two terminal electrodes 114, 115 for routing an external power source to the driver circuit 116.

Figure 2A:
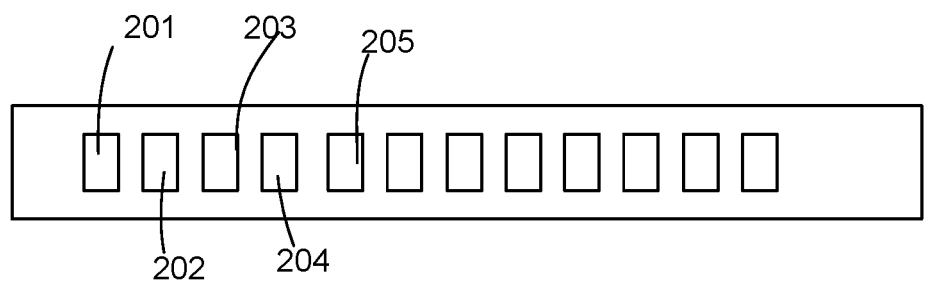
FIG. 2A illustrates a first example of an elongated substrate mounted with light emitted diodes.

Please refer to FIG. 2A. FIG. 2A illustrates a first example of an elongated substrate mounted with light emitted diodes.

In FIG. 2A, there are multiple light emitted diodes disposed on an elongated substrate which may be transparent or non-transparent. As mentioned above, the light emitted diodes 201, 202, 203, 204, 205 may correspond to the first light emitted diode, the second light emitted diode, the third light emitted diode, the fourth light emitted diode, the fifth light emitted diode.

Alternatively, the light emitted diodes 201, 202, 203, 204, 205 may all correspond to the first light emitted diode, while other light emitted diodes are arranged adjacent to the first light emitted diode or another positions on the same elongated substrate or on a different elongated substrate.

Figure 2B:
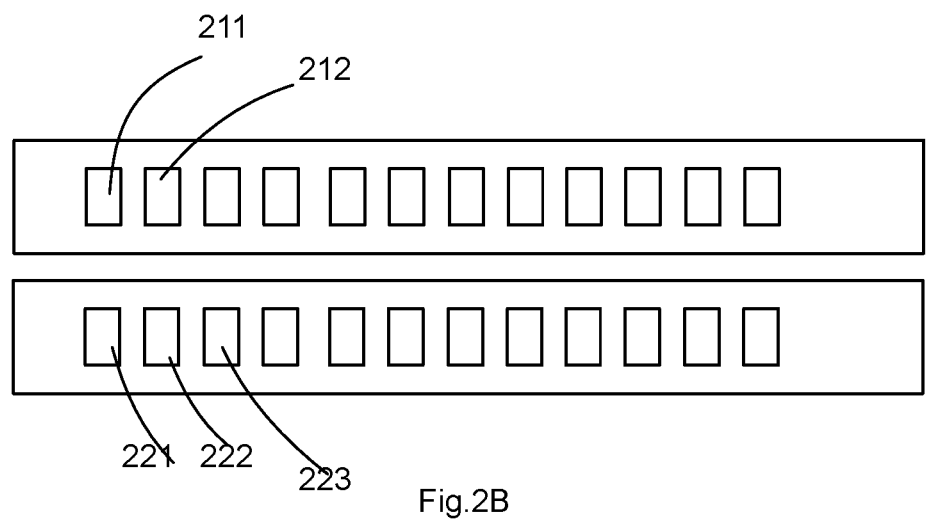
FIG. 2B illustrates a second example of elongated substrates mounted with light emitted diodes.

Please refer to FIG. 2B. FIG. 2B illustrates a second example of elongated substrates mounted with light emitted diodes. There may be only one elongated substrate mounted with multiple types of light emitted diodes. In other cases, each elongated substrate may be mounted with an associated light emitted diode. In other words, each elongated substrate may correspond a different white light or a different color light.

For example, the light emitted diodes 211, 212 may correspond to the first light emitted diode and the third light emitted diode that generate white lights.

The light light emitted diodes 221, 222, 223 on another elongated substrate may correspond to red, green and blue lights.

Figure 3:
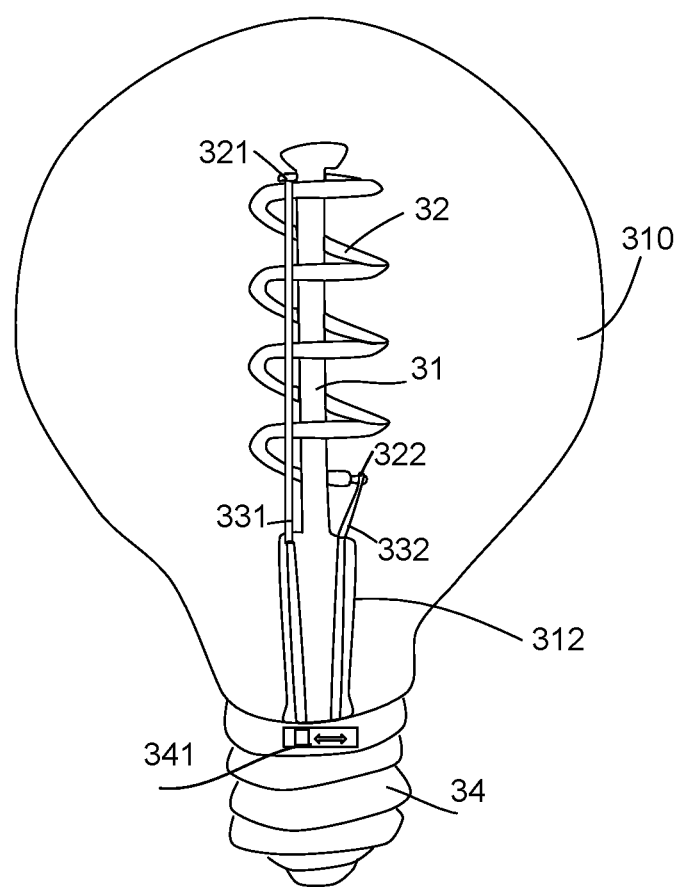
FIG. 3 illustrates a flexible elongated substrate embodiment.

Please refer to FIG. 3. FIG. 3 illustrates a flexible elongated substrate embodiment.

In FIG. 3, the light apparatus includes a flexible elongated substrate 32 with two electrodes 321, 322 connected to wires 331, 332 connected to a driver circuit (not shown). There is a bulb shell 310 enclosing the flexible elongated substrate 32 mounted with light emitted diodes as mentioned above.

There is a central support 31 for fixing the bending shape of the flexible elongated substrate 32. There is a manual switch 341 for users to set a desired color or a desired color temperature or other parameter. A driver circuit and a control circuit (not shown) are enclosed in the light bulb cap 34.

Figure 4A:
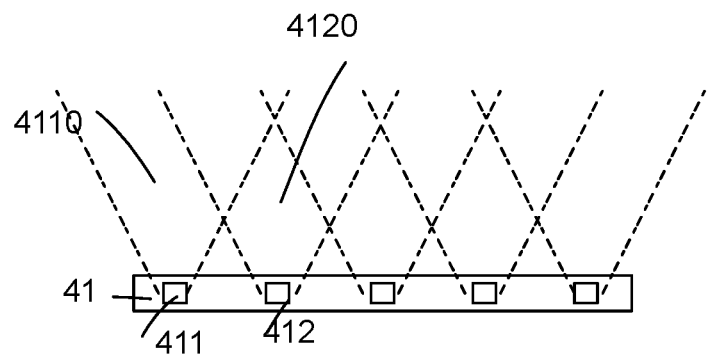
FIG. 4A illustrates light spanning areas of an elongated substrate.

Please refer to FIG. 4A. FIG. 4A illustrates light spanning areas of an elongated substrate.

In FIG. 4A, there are multiple light emitted diodes 411, 412 mounted on an elongated substrate 41 emitting light with main light emitting angles, e.g. 120 degrees. The light spanning areas 4110, 4120 are overlapped partially to enhanced mixed effect.

Figure 4B:
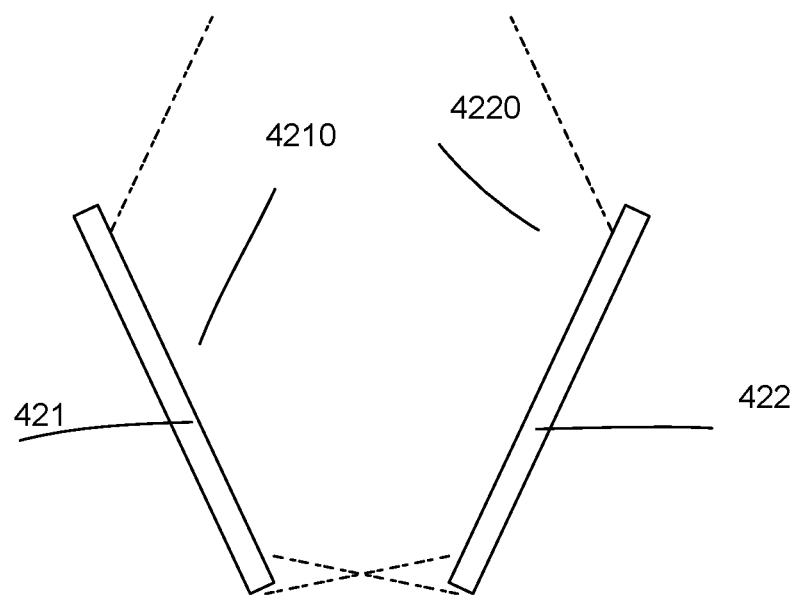
FIG. 4B illustrates light spanning area overlapping between two elongated substrates.

Please refer to FIG. 4B. FIG. 4B illustrates light spanning area overlapping between two elongated substrates.

The two elongated substrates 421, 422 have overlapping spanning areas 4210, 4220.

Figure 5:
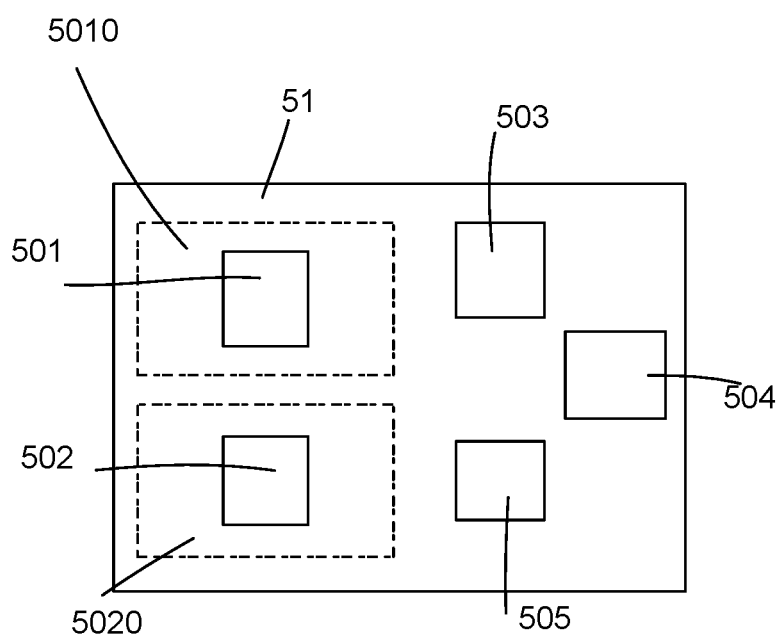
FIG. 5 illustrates a package module mounted with multiple types of light emitted diodes.

Please refer to FIG. 5. FIG. 5 illustrates a package module mounted with multiple types of light emitted diodes.

In FIG. 5, a package module 51 includes a first light emitted diode 501 covered with a first fluorescent layer 5010. The package module 51 also includes a third light emitted diode 5020 covered with a third fluorescent layer 5020. There are also three light emitted diodes 503, 504, 505 emitting different colors are packaged in the package module 51.

In some embodiments, a light apparatus like a light bulb, a down light, a panel light, a light tube includes at least one elongated substrate mounted with a first light emitted diode covered with a first fluorescent layer and a second light emitted diode not covered with fluorescent layer.

Specifically, there may be only one elongated substrate mounted with one or more of the first light emitted diode and the second light emitted diode. There may be two or more elongated substrates respectively mounted with the first light emitted diode and the second light emitted diode. The first light emitted diode and the second light emitted diode may be disposed on the same elongated substrate or on separate elongated substrate.

The first light emitted diode may be a blue light light emitted diode covered with the first fluorescent layer for emitting a white light with a first color temperature. In some embodiments, there may be a third light emitted diode covered with a third fluorescent layer also emitting a white light but with a different color temperature. In such case, the first light emitted diode and the third light emitted diode may be mixed for generating a white light with a mixed color temperature.

The first light emitted diode and the third light emitted diode may be packaged or disposed adjacent to each other to enhance mixing effect.

The second light emitted diode may emit a red light. In addition, there may be a fourth light emitted diode, a fifth light light emitted diode emitting lights of different color like a blue light and a green light. The second light emitted diode, the fourth light emitted diode and the fifth light emitted diode may be used to mix a mixed color light output.

Furthermore, the first light emitted diode and the third light emitted diode may be adjusted for their output light strengths so that to mix a white light with a different color temperature.

Similarly, the second light emitted diode, the fourth light emitted diode and the fifth light emitted diode may be adjusted for their output strengths to generate a different light output.

There may be a first mode, in which only the first light emitted diode and the third light emitted diode are activated while the second light emitted diode, the fourth light emitted diode, and the fifth light emitted diode are deactivated. There may be a second mode, in which only the second light emitted diode, the fourth light emitted diode, the fifth light emitted diode are activated while the first light emitted diode and the third light emitted diode are deactivated.

There may be a third mode, in which all light emitted diodes are activated but adjusted to obtained a desired light parameter.

The light apparatus also has a driver circuit supplying a driving current to the first light emitted diode and the second light emitted diode. For example, the driver circuit may include multiple components including passive components and active components for converting a 110V or 220V AC power source to a DC driving current or multiple DC driving currents to the first light emitted diode and the second light emitted diode. A current source circuit may be used for generating a stable, variable current or PWM (Pulse Width Modulation) circuit may be integrated for generating corresponding driving currents to the light emitted diodes.

The light emitted diodes may include light emitted diode chips and corresponding circuits.

The light apparatus also has a control circuit connected to the driver circuit for mixing a first light output with the first light emitted diode and the second light emitted diode.

The control circuit may be programmed or hard wired for storing status, setting or parameters of the light emitted diodes. Specifically, the control circuit may be integrated together with the driver circuit or be a separate component that receives command or settings for controlling the driver circuit to generate corresponding currents to drive the light emitted diode to obtained desired light output.

In some embodiments, wherein the first light emitted diode emits a white light, and the second light emitted diode emits a non-white light.

In some embodiments, the light apparatus may also include a third light emitted diode covered with a third fluorescent layer, wherein the first fluorescent layer is different from the third fluorescent layer so that the first light emitted diode combined with the first fluorescent layer and the third light emitted diode combined with the third fluorescent layer emit white lights of different color temperatures.

In some embodiments, the control circuit adjusts the output strength ratio between the first light emitted diode and the third light emitted diode to obtain a mixed white light with a mixed color temperature.

In some embodiments, the control circuit changes a relative duty ratio between the first light emitted diode and the third light emitted diode. Specifically, in PWM driving scheme, by adjusting duty ratio, the output strength may be changed accordingly.

In some embodiments, 6. The light apparatus of claim 4, wherein the control circuit changes a relative current ratio between the first light emitted diode and the third light emitted diode.

In some embodiments, the second light emitted diode emits a second light with a second non-white color.

In some embodiments, the light apparatus also includes a fourth light emitted diode and a fifth light emitted diode respectively emit a fourth light with a fourth non-white color and a fifth light with a fifth non-white color, the second non-white color. The fourth non-white color and the fifth non-white color are different colors.

For example, the second light emitted diode emits red light, the fourth light emitted diode emits green light and the fifth light emitted diode emits blue light.

In some embodiments, the control circuit adjusts output strengths of the second light emitted diode, the fourth light emitted diode and the fifth light emitted diode to change the non-white color.

In some embodiments, the control circuit has a first mode and a second mode. The first light emitted diode is mixed with a third light emitted diode to generate a mixed white light of a mixed color temperature in the first mode.

The second light emitted diode is mixed with a fourth light emitted diode and a fifth light emitted diode to mix a mixed light with a mixed color. The second light emitted diode, the fourth light emitted diode and the fifth light emitted diode emit lights of different colors.

In some embodiments, the first mode and the second mode are not activated at the same time.

In some embodiments, the light apparatus also includes a bulb shell and a bulb cap. The bulb cap contains the driver circuit and the control circuit and the elongated substrate is enclosed in the bulb shell.

The elongated substrate may be made of rigid material. For example, the elongated substrate may include an aluminum layer, an insulation layer, a wiring layer, and a light emitted diode mounting layer for mounting the light emitted diodes.

Each elongated substrate may also has two electrodes to be connected to other elongated substrate to construct a three-dimension light body emitting light evenly in a three-dimension space.

In some embodiments, the elongated substrate is made of a flexible material and is bent with a curve shape. For example, the elongated substrate may include a flexible printed circuit board for mounting the light emitted diodes. Some additional layer like thin aluminum layer may be attached so as to keep the bent shape of the elongated substrate.

In some embodiments, the elongated substrate is a rigid material.

In some embodiments, there are multiple elongated substrates connected forming a three-dimension light emitting body.

In some embodiments, there is a central column supporting tops of the multiple elongated substrates.

In some embodiments, the elongated substrate has multiple segments, some segments are covered with the first fluorescent layer.

In some embodiments, there are multiple elongated substrates, at least one elongated substrate mounted with only the first light emitted diode and at least another elongated substrate mounted with a second light emitted diode.

In some embodiments, the first light emitted diode and the second light emitted diode respectively have a first light spanning area and a second light spanning area, the first light spanning area and the second light spanning area are overlapped.

In some embodiments, light spanning areas of a plurality of the elongated substrates overlap so that the first light spanning area and the second light spanning area are overlapped.

Specifically, there is a main light emitting area in which accumulates main light output, e.g. 120 degrees, for forming a light spanning area of a light diode. When multiple light diodes are placed in an elongated substrate, there is a main light output area, e.g. 90% of light, in a light spanning area of the elongated substrate.

By arranging the pose, angle and position of the light emitted diodes and the elongated substrate to keep the light output of different types of light emitted diodes to overlap at least partially enhance the final mixed light characteristic.

In some embodiments, there are multiple first light emitted diodes and multiple second light emitted diodes disposed across to each other.

In some embodiments, the light apparatus also includes a wireless circuit connected to the control circuit.

In some embodiments, the wireless circuit receives an external command for the control circuit to determine how to mix the first light output of the first light emitted diode and the second light emitted diode.

In addition, the wireless circuit may be connected to an antenna that is placed away from the driver circuit, e.g. in a light bulb shell instead of being concealed in a light bulb cap for enhancing wireless signal quality.

In some embodiments, the light apparatus also includes a manual switch for indicating a mixed parameter of the first light emitted diode and the second light emitted diode.

In some embodiments, the first light emitted diode and the second light emitted diode are packaged as a packaged module. Specifically, the first light emitted diode and the second emitted diode may be integrated and packaged together. In some other embodiments, the first light emitted diode is integrated with the third light emitted diode in a package while the second light emitted diode, the fourth light emitted diode and the fifth light emitted diode are integrated in another package.

In some embodiments, the packaged module also has a third light emitted diode covered with a third fluorescent layer for emitting a third white light, a fourth light emitted diode and a fifth light emitted diode for emitting different colors as the second light emitted diode.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:
1. A light apparatus comprising:
at least one elongated substrate mounted with a first light emitted diode covered with a first fluorescent layer and a second light emitted diode not covered with fluorescent layer;
a driver circuit supplying a driving current to the first light emitted diode and the second light emitted diode;
a third light emitted diode covered with a third fluorescent layer, wherein the first fluorescent layer is different from the third fluorescent layer so that the first light emitted diode combined with the first fluorescent layer and the third light emitted diode combined with the third fluorescent layer emit white lights of different color temperatures; and
a control circuit connected to the driver circuit for mixing a first light output with the first light emitted diode and the second light emitted diode, wherein the second light emitted diode emits a non-white light, wherein the control circuit adjusts the output strength ratio between the first light emitted diode and the third light emitted diode to obtain a mixed white light with a mixed color temperature, wherein the control circuit has a first mode and a second mode, wherein in the first mode, the first light emitted diode combined with the first fluorescent layer is mixed with the third light emitted diode combined with the third fluorescent layer to generate a mixed white light of a mixed color temperature, wherein in the second mode, the second light emitted diode is mixed with a fourth light emitted diode and a fifth light emitted diode to mix a mixed light with a mixed color, wherein the second light emitted diode, the fourth light emitted diode and the fifth light emitted diode emit lights of different colors.

2. The light apparatus of claim 1, wherein the control circuit changes a relative duty ratio between the first light emitted diode and the third light emitted diode.

3. The light apparatus of claim 1, wherein the control circuit changes a relative current ratio between the first light emitted diode and the third light emitted diode.

4. The light apparatus of claim 1, wherein the second light emitted diode emits a second light with a second non-white color.

5. The light apparatus of claim 4, further comprising a fourth light emitted diode and a fifth light emitted diode respectively emit a fourth light with a fourth non-white color and a fifth light with a fifth non-white color, the second non-white color, the fourth non-white color and the fifth non-white color are different colors.

6. The light apparatus of claim 5, wherein the control circuit adjusts output strengths of the second light emitted diode, the fourth light emitted diode and the fifth light emitted diode to change the non-white color.

7. The light apparatus of claim 1, wherein the first mode and the second mode are not activated at the same time.

8. The light apparatus of claim 1, further comprising a bulb shell and a bulb cap, wherein the bulb cap contains the driver circuit and the control circuit, the elongated substrate is enclosed in the bulb shell.

9. The light apparatus of claim 1, wherein the elongated substrate is made of a flexible material and is bent with a curve shape.

10. The light apparatus of claim 1, wherein the elongated substrate is a rigid material.

11. The light apparatus of claim 10, wherein there are multiple elongated substrates connected forming a three-dimension light emitting body.

12. The light apparatus of claim 11, wherein there is a central column supporting tops of the multiple elongated substrates.

13. The light apparatus of claim 1, wherein the elongated substrate has multiple segments, some segments are covered with the first fluorescent layer.

14. The light apparatus of claim 1, wherein there are multiple elongated substrates, at least one elongated substrate mounted with only the first light emitted diode and at least another elongated substrate mounted with a second light emitted diode.

15. The light apparatus of claim 14, wherein the first light emitted diode and the second light emitted diode respectively have a first light spanning area and a second light spanning area, the first light spanning area and the second light spanning area are overlapped.

16. The light apparatus of claim 15, wherein light spanning areas of a plurality of the elongated substrates overlap so that the first light spanning area and the second light spanning area are overlapped.

17. The light apparatus of claim 1, wherein there are multiple first light emitted diodes and multiple second light emitted diodes disposed across to each other.

18. The light apparatus of claim 1, further comprising a wireless circuit connected to the control circuit.

19. The light apparatus of claim 18, wherein the wireless circuit receives an external command for the control circuit to determine how to mix the first light output of the first light emitted diode and the second light emitted diode.

20. The light apparatus of claim 1, further comprising a manual switch for indicating a mixed parameter of the first light emitted diode and the second light emitted diode.

21. The light apparatus of claim 1, wherein the first light emitted diode and the second light emitted diode are packaged as a packaged module.

22. The light apparatus of claim 21, wherein the packaged module also has a third light emitted diode covered with a third fluorescent layer for emitting a third white light, a fourth light emitted diode and a fifth light emitted diode for emitting different colors as the second light emitted diode.

* * * * *